United States Patent [19]
Chen et al.

[11] Patent Number: 5,837,576
[45] Date of Patent: Nov. 17, 1998

[54] METHOD FOR FORMING A CAPACITOR USING A SILICON OXYNITRIDE ETCHING STOP LAYER

[75] Inventors: Li-Yeat Chen; Jin-Dong Chen; Erik S. Jeng; Ing-Ruey Liaw, all of Hsinchu, Taiwan

[73] Assignee: Vanguard International Semiconductor Corporation, Hsinchu, Taiwan

[21] Appl. No.: 961,577

[22] Filed: Oct. 31, 1997

[51] Int. Cl.[6] .............................................. H01L 21/8242
[52] U.S. Cl. .......................................... 438/253; 438/255
[58] Field of Search .................................. 438/253–255, 438/396–398

[56] References Cited

U.S. PATENT DOCUMENTS 5,554,557  9/1996  Koh .
5,618,747  4/1997  Lou .

*Primary Examiner*—Jey Tsai
*Attorney, Agent, or Firm*—Christensen, O'Connor, Johnson & Kindness PLLC

[57] ABSTRACT

A polysilicon layer is deposited on a dielectric layer. A silicon oxynitride layer is then formed on the polysilicon layer. A photoresist is imprinted with a pattern on the silicon oxynitride layer to define the storage node. An etching step is used to etch the silicon oxynitride layer and the polysilicon layer to formed the storage node. A HSG silicon is deposited on the silicon oxynitride layer and on the side walls of the storage node. An isotropically etching step is performed to remove the HSG layer on the top of the storage node. The silicon oxynitride is then removed. A dielectric layer is then formed along the surface of the storage node. A conductive layer is deposited over the dielectric layer. The conductive layer is used as the top storage node.

8 Claims, 3 Drawing Sheets

METHOD FOR FORMING A CAPACITOR USING A SILICON OXYNITRIDE ETCHING STOP LAYER

FIELD OF THE INVENTION

The present invention relates to a semiconductor device, and more specifically, to a method of making a capacitor having a silicon oxynitride layer as an HSG (hemispherical-grain silicon) etchback stop layer.

BACKGROUND OF THE INVENTION

The trend in manufacturing submicron devices to an ever more compacted area affects the overall design of integrated circuits. Integrated circuits, such as DRAMs, are a composition of memory cells in which each of the memory cells is reduced in its physical size to reduce the overall dimension of the integrated circuits. A memory cell for each bit in a DRAM typically includes a storage capacitor and an access transistor. A source or drain of the transistor is connected to one of the terminals of the storage capacitor. In effect, a DRAM memory cell is formed by a combination of a transistor, a capacitor and contacts to external circuitry.

The advent of Ultra Large Scale Integrated (ULSI) technologies has significantly and continuously decreased size of a memory cell used to manufactured integrated circuits. The reduction in the space available to imprint integrated circuits has in turn caused a reduction in the capacitor area, which further in turn affects the reduction in cell capacitance. In addition the size of a chargeable space capable of being stored by the capacitor also decreases. The consequences of the reduction in the dimension a semiconductor die causes the fabrication of a capacitor to susceptible to particle interferences.

Several DRAM cells have been developed to overcome such problems. For example, a capacitor with a hemispherical grain (HSG) silicon storage node has been developed. The HSG-Si is deposited by a low pressure chemical vapor deposition method at a transition temperature from amorphous-Si to polycrystalline-Si. Further, a cylindrical capacitor using hemisphericalgrained Si has been proposed (see "A New Cylindrical Capacitor Using Hemispherical Grained Si FOR 256 Mb DRAMs", H. Watanabe et al., Tech Dig, December 1992. pp.259–262).

Conventionally, after the HSG is formed on a storage node of a capacitor, an etching step follows to etch the HSG silicon. However, a rugged silicon layer formed on top of the storage node introduces a high leakage current after the etching step. This problem occurs because a portion of the storage node is etched while the etching step is performed. A depletion effect is another reason that causes the leakage current to occur. The etching step also causes a problem associated with HSG grain adhesion reliability. In 0.25 micron process, the etching module has difficulties to achieve a good selectivity between an oxide and a photoresist. The edges of the HSG layer on top of the storage node still exist in a spike shape, and thus, this is not suitable for 0.25 micron process.

SUMMARY OF THE INVENTION

A polysilicon layer is deposited on the dielectric layer to serve as a storage node of a capacitor. A silicon oxynitride layer is formed on the polysilicon layer to serve as an etching stop layer and a bottom anti reflective coating (BARC) layer. A photoresist imprints a pattern on the silicon oxynitride layer to define the storage node. An etching follows to etch the silicon oxynitride layer and the polysilicon layer to formed the storage node. The photoresist is then stripped away.

A HSG silicon is deposited on the silicon oxynitride layer and on the side walls of the storage node. An isotropically etching step is performed to remove the HSG layer on top of the storage node. The etching step will stop at the surface of the silicon oxynitride layer due to the high etching selectivity between a HSG silicon and a silicon oxynitride. A dielectric layer is formed along the surface of the storage node. A conductive layer is deposited over the dielectric layer. The conductive layer is used as the top storage node and is formed by a doped polysilicon, an in-situ doped polysilicon, an aluminum, a copper, a tungsten or a titanium.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention relates to a method of making a high density memory cell for DRAM, which has an enlarge surface area of the capacitor to increase the performance of the memory cell. The present invention further uses high etching selectivity between a HSG silicon and a silicon oxynitride to form a capacitor structure. The detail processes will be described as follows.

Figure 1:
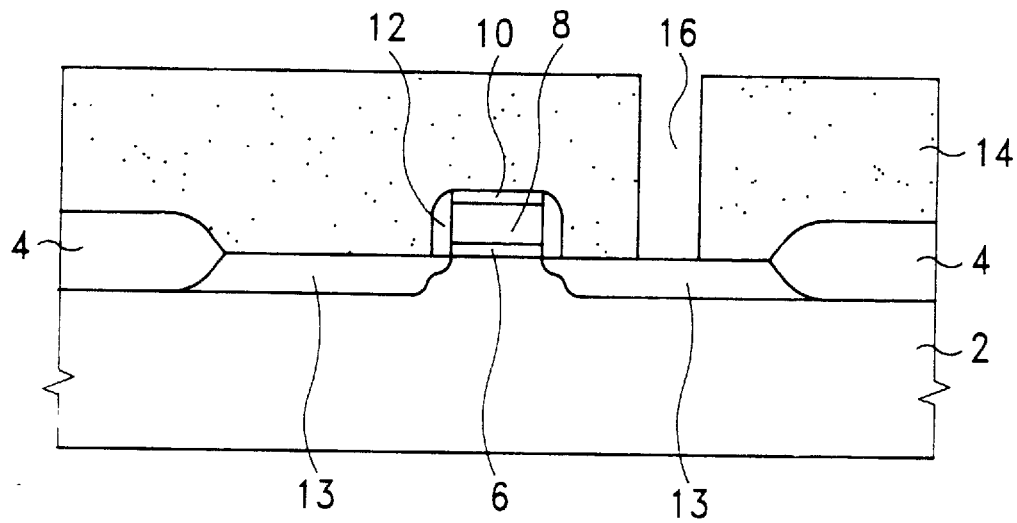
FIG. 1 is a cross sectional view of a semiconductor wafer illustrating the step of forming a gate structure on a semiconductor wafer.

Referring to FIG. 1, a single crystal P-type substrate 2 with a <100> crystallographic orientation is used for the preferred embodiment. A thick field oxide region 4, fox 4, is created for the purposes of isolation. It is well known in the art that shallow trench isolation technologies can be also be used for isolation. Generally, the fox 4 region is created via photolithography and dry etching steps to etch a silicon nitride-silicon dioxide composite layer. After the photoresist is removed and wet cleaned, a thermal oxidation in an oxygen-steam ambient is used to form the fox 4 region, to a thickness of about 3000–8000 angstroms.

A silicon dioxide layer 6 is created atop the substrate 2 to use as a gate oxide. In the preferred embodiment, the silicon dioxide layer 6 is formed by using an oxygen-steam ambient at a temperature between about 850° to 1000° C. Alternatively, the gate oxide 6 may be formed using other known oxide chemical compositions and procedures. In the preferred embodiment, the thickness of the silicon dioxide layer 6 is approximately 50–200 angstroms.

After the first silicon dioxide layer 6 is formed, a polysilicon layer 8 is formed over the silicon dioxide layer 6 and the field oxide regions 4. In the preferred embodiment, the first polysilicon layer 8 is formed by using conventional chemical vapor deposition (CVD) to have a thickness about 2000–4000 angstroms. It is well know in the art on how to formed a word line, a bit line (not shown), gate structures with cap layer 10, side wall spacers 12, source and drain 13.

At least one dielectric layer 14 for isolation is formed on the gate structures, fox 4 and substrate 2. The dielectric layer 14 is preferably formed from a silicon oxide, a silicon nitride or other similar type of materials. As well known in the art, a contact hole 16 for an electrical connection is generated in the dielectric layer 14 using lithography and etching.

Figure 2:
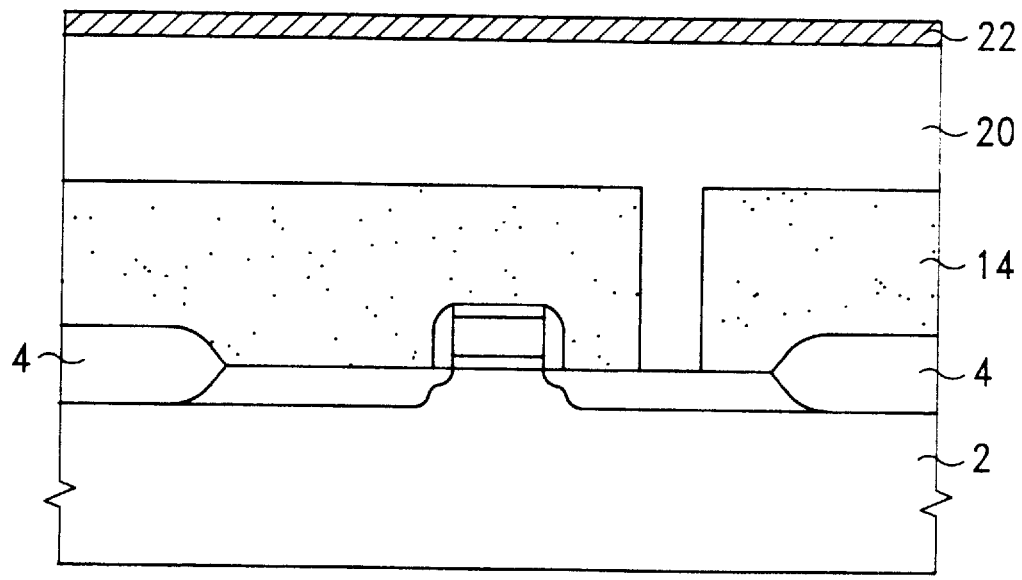
FIG. 2 is a cross sectional view of a semiconductor wafer illustrating the step of forming a silicon oxynitride layer and a polysilicon layer on the semiconductor wafer.

Turning to FIG. 2, a polysilicon layer 20 is deposited on the dielectric layer 14 and refilled into the contact hole 16 to serve as a storage node of a capacitor. Preferably, the polysilicon layer 20 can be formed using a doped amorphous silicon, a doped polysilicon, or an in-situ doped polysilicon. A silicon oxynitride layer 22 is formed on the polysilicon layer 20 to serve as an etching stop layer for subsequent etching back process. The thickness of the silicon oxynitride layer 22 is about 200 to 1000 Angstroms. The silicon oxynitride layer 22 is formed by reacting $N_2O$ and $SiH_4$ at a temperature approximately 300 to 600 centigrade.

Figure 3:
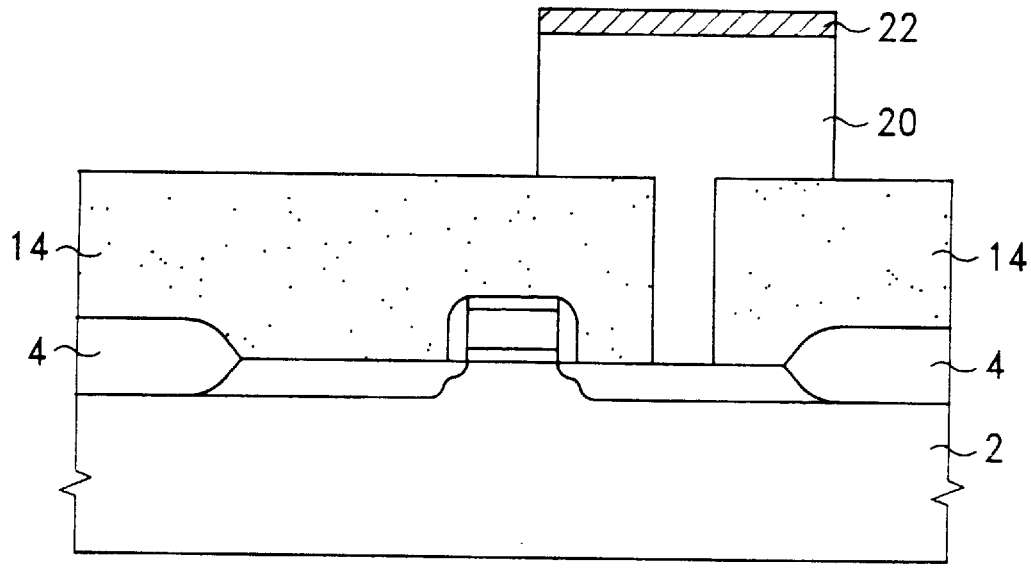
FIG. 3 is a cross sectional view of a semiconductor wafer illustrating the step of forming a storage node of a capacitor.

Turning next to FIG. 3, a photoresist is imprinted with a pattern on the silicon oxynitride layer 22 to define the storage node. An etching step is used to etch the silicon oxynitride layer 22 and the polysilicon layer 20 until the dielectric layer 14 is reached to formed the storage node. The photoresist is then stripped away. This silicon oxynitride layer 22 also serves as a bottom anti reflective coating (BARC) layer for patterning the polysilicon layer 20.

Figure 4:
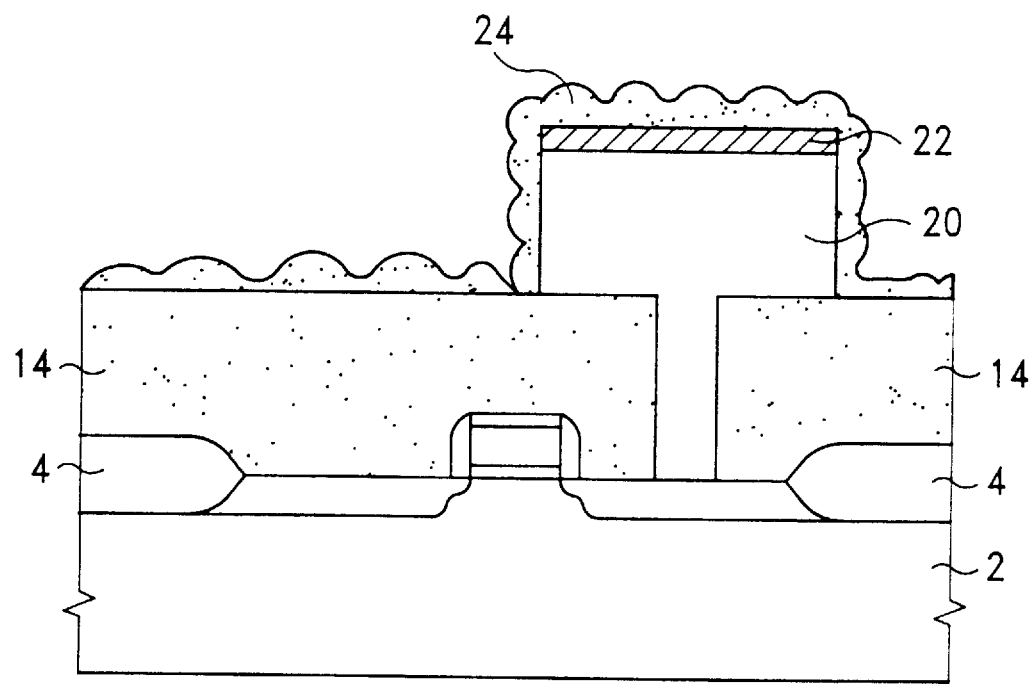
FIG. 4 is a cross sectional view of a semiconductor wafer illustrating the step of forming a HSG silicon layer on the silicon oxynitride layer and the polysilicon layer.

Referring to FIG. 4, the HSG silicon 24 is deposited on the following layers: the silicon oxynitride layer 22, a portion of the dielectric layer 14 and the side walls of the storage node 20. The depositing of the HSG silicon 24 is performed by a low pressure chemical vapor deposition method at a transition temperature from amorphous-Si to polycrystalline-Si. The HSG silicon 24 can be formed by a seeding method.

Figure 5:
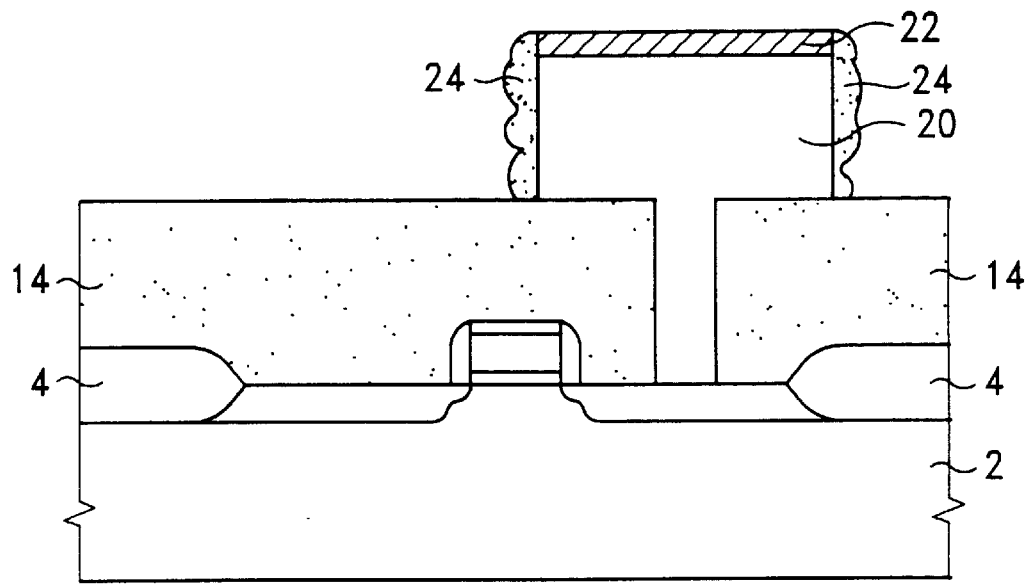
FIG. 5 is a cross sectional view of a semiconductor wafer illustrating the step of removing the HSG silicon that is on the silicon oxynitride layer.

Turning to FIG. 5, an anisotropically etching step is performed to etch the HSG layer and to etch a portion of the HSG silicon 24 still remains on the side walls of the storage node 20. The HSG silicon 24 on top of the storage node 20 is then completely removed. The etching step will stop at the surface of the silicon oxynitride layer 22 due to the high etching selectivity between a HSG silicon 24 and a silicon oxynitride 22.

Figure 6:
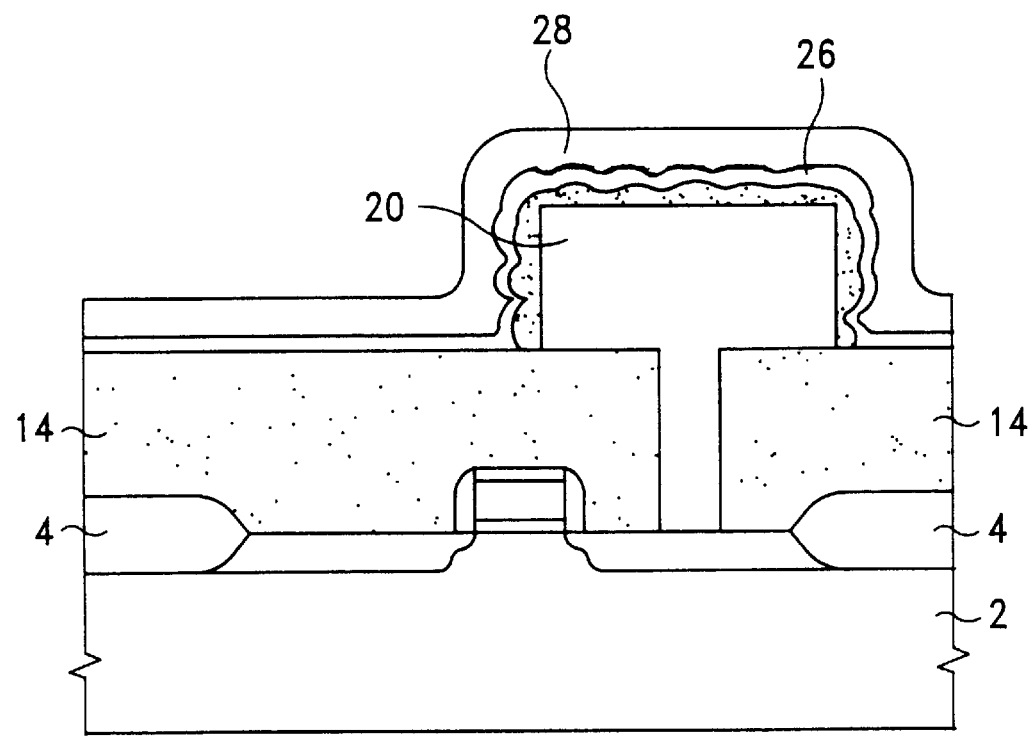
FIG. 6 is a cross sectional view of a semiconductor wafer illustrating the step of forming a dielectric layer and forming a conductive layer on the dielectric layer.

Referring to FIG. 6, the silicon oxynitride layer 22 is then removed. A dielectric film 26 is deposited along the surface of the storage node 20 and the dielectric layer 24. The dielectric layer 26 is preferably formed of either a double film of nitride/oxide film, a triple film of oxide/nitride/oxide, or any other types of high dielectric films such as a tantalum oxide(Ta2O5). A conductive layer 28 is deposited over the dielectric layer 26. The conductive layer 28 is used as the top storage node and is formed of a doped polysilicon, an in-situ doped polysilicon, an aluminum, a copper, a tungsten or a titanium.

As is understood by a person skilled in the art, the foregoing preferred embodiment of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of manufacturing a capacitor, comprising the steps of:

forming a silicon layer;

forming a silicon oxynitride layer on said silicon layer to serve as an etching stop layer and a bottom anti reflective bottom coating;

patterning said silicon layer and said silicon oxynitride layer to define a first storage node for said capacitor;

forming a hemispherical grained (HSG) silicon on side walls of said first storage node and on said silicon oxynitride layer;

removing said HSG silicon on said silicon oxynitride layer;

removing said silicon oxynitride layer and a portion of said HSG layer remaining on said side walls of said first storage node;

forming a dielectric layer along a surface of said first storage node and on said portion of said HSG layer; and forming a conductive layer over said dielectric layer to serve as a second storage node of said capacitor.

2. The method of claim 1, wherein said silicon oxynitride layer has a thickness about 200–1000 angstroms.

3. The method of claim 1, wherein said HSG silicon on said silicon oxynitride layer is removed by an anisotropically etching.

4. The method of claim 1, wherein said dielectric layer is formed of a tantalum oxide ($Ta_2O_5$).

5. The method of claim 1, wherein said dielectric layer is formed of a triple film of oxide/nitride/oxide.

6. The method of claim 1, wherein said dielectric film is formed of a double film of nitride/oxide film.

7. The method of claim 1, wherein said silicon layer comprises a doped amorphous silicon, a doped polysilicon, an in-situ doped polysilicon.

8. The method of claim 1, wherein said conductive layer comprises a doped polysilicon and an in-situ doped polysilicon.

* * * * *